(12) United States Patent
Heath

(10) Patent No.: US 7,016,408 B2
(45) Date of Patent: Mar. 21, 2006

(54) METHOD, SYSTEM AND COMPUTER PROGRAM PRODUCT FOR LZJH DATA COMPRESSION WITH MINIMUM REDUNDANCY CODING

(75) Inventor: Robert Jeff Heath, San Diego, CA (US)

(73) Assignee: The DirecTV Group, Inc., El Segundo, CA (US)

( * ) Notice: Subject to any disclaimer, the term of this patent is extended or adjusted under 35 U.S.C. 154(b) by 889 days.

(21) Appl. No.: 10/054,219

(22) Filed: Nov. 9, 2001

(65) Prior Publication Data

US 2003/0031246 A1 Feb. 13, 2003

Related U.S. Application Data

(60) Provisional application No. 60/311,781, filed on Aug. 10, 2001.

(51) Int. Cl.
*H04N 7/12* (2006.01)
(52) U.S. Cl. .................................. 375/240.01
(58) Field of Classification Search ........... 375/240.01, 375/240.23, 240.26; 370/524; H04N 7/12
See application file for complete search history.

(56) References Cited

U.S. PATENT DOCUMENTS 6,768,749 B1 * 7/2004 Osler et al. ................. 370/524

OTHER PUBLICATIONS

McLaughlin, Timothy J., The Benefits and Drawbacks fo HTTP Compression, 2005, Lehigh University.*
Fenwick, Peter; Differential Ziv-Lempel Text Compression, Aug. 28, 1995, Journal of Universal Computer Science, vol. 1, No. 8, pps. 591-602.*
Mitzenmacher, Michael, On the Hardness of Finding Optimal Multiple Preset Dictionaries, Jul. 2004, IEEE Transactions on Information Theory, vol. 50, No. 7, pps. 1536-1539.*
Fenwick, Peter, Block Sorting Text Compression—Final Report, Apr. 23, 1996, Technical Report 130, ISSN 1173-3500. The University of Auckland, New Zealand.*
Heath, Jeff, LZH Data Compression, Apr. 14, 1999, Telecommunications Industry Association (TIA), TR-30. 1/99-02-004R1, pps. 1-12.*

* cited by examiner

*Primary Examiner*—Young Lee
(74) *Attorney, Agent, or Firm*—Georgann S. Grunebach

(57) ABSTRACT

A method, system and computer program product for encoding and decoding data over a communications channel, including receiving input data to be encoded; generating compressed codes from the input data using a Lempel-Ziv-Jeff-Heath (LZJH) data compression algorithm; and applying a minimum redundancy coding algorithm on the compressed codes to generate compressed data.

75 Claims, 6 Drawing Sheets

US 7,016,408 B2

METHOD, SYSTEM AND COMPUTER PROGRAM PRODUCT FOR LZJH DATA COMPRESSION WITH MINIMUM REDUNDANCY CODING

CROSS REFERENCE TO RELATED DOCUMENTS

The present invention claims the benefit of priority under 35 U.S.C. § 119(e) to U.S. Provisional Patent Application No. 60/311,781 of Heath, entitled "LZJH DATA COMPESSION WITH HUFFMAN CODING," filed on Aug. 10, 2001, is related to commonly owned U.S. Pat. Nos. 5,955, 976 and 5,973,630 to Heath and includes use of various technologies described in the references identified in the appended LIST OF REFERENCES and cross-referenced throughout the specification by numerals in brackets corresponding to the respective references, the entire contents of all of which are incorporated by reference herein.

BACKGROUND OF THE INVENTION

1. Field of the Invention

The present invention generally relates to data compression and more particularly to a method, device and computer program product for Lempel-Ziv-Jeff-Heath (LZJH) data compression with minimum redundancy coding, such as fixed Huffman coding, dynamic Huffman coding, etc.

2. Discussion of the Background

In recent years, an algorithm known as DEFLATE compression algorithm, defined in RFC1951 [3], which operates in the IP Payload Compression Protocol (IPComp) application as defined in RFC2394 [4] has been developed. The DEFLATE compression algorithm improves upon the Lempel-Ziv 1977 (LZ77) compression algorithm by providing a second compression step that takes the compressed output of LZ77 algorithm and further compresses it using either fixed or dynamic Huffman coding [1]. The result is an algorithm that typically achieves 10%–15% better compression than the best LZ77 algorithms, such as Stac Lempel-Ziv standard (Stac LZS) compression algorithm [5] and that typically achieves the same compression as the LZJH compression algorithm [2] in the IPComp environment.

However, while the DEFLATE algorithm improves upon the LZ77 algorithm, the DEFLATE algorithm does not improve upon the LZJH algorithm in that the LZJH algorithm is different from the LZ77 algorithm.

Therefore, there is a need for a method, system and computer program product for improving the data compression of the LZJH algorithm.

SUMMARY OF THE INVENTION

The above and other needs are addressed by the present invention, which provides an improved method, system and computer program product for Lempel-Ziv-Jeff-Heath (LZJH) data compression with minimum redundancy coding, such as fixed Huffman coding, dynamic Huffman coding, etc.

Accordingly, in one aspect of the present invention there is provided an improved method, system and computer program product for encoding and decoding data over a communications channel, including receiving input data to be encoded; generating compressed codes from the input data using a Lempel-Ziv-Jeff-Heath (LZJH) data compression algorithm; and applying a minimum redundancy coding algorithm on the compressed codes to generate compressed data.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

A method, system and computer program product for Lempel-Ziv-Jeff-Heath (LZJH) data compression with minimum redundancy coding, such as fixed Huffman coding, dynamic Huffman coding, etc., are described. In the following description, for purposes of explanation, numerous specific details are set forth in order to provide a thorough understanding of the present invention. It is apparent to one skilled in the art, however, that the present invention may be practiced without these specific details or with an equivalent arrangement. In some instances, well-known structures and devices are shown in block diagram form in order to avoid unnecessarily obscuring the present invention.

Generally, the present invention applies to LZJH Data Compression [2], which has use in many forms of wireless and wireline data communications. The present invention improves upon the LZJH algorithm, creating an algorithm based on LZJH that is potentially better than LZJH in some applications. The present invention may improve the compression ratio of the LZJH Data Compression algorithm when compressing IP packets individually, such as in the IP Payload Compression Protocol (IPComp) application [4]. Since LZJH typically achieves 10%–15% better compression ratios than the best LZ77 algorithms, it is likely that adding a second Huffman coding [1] step applied to the output of the LZJH algorithm would improve the compression ratio of LZJH by some 10%.

The present invention includes recognition that there is a disadvantage in applying a second step to the LZJH algorithm, in that this affects the complexity of the algorithm and has a corresponding adverse affect on the execution speed of LZJH encoding and decoding processes. However, the present invention includes recognition that as the speed of processors and Application Specific Integrated Circuits (ASICs) increases, in many applications, execution speed becomes less important, as compared to compression efficiency.

Figure 1:
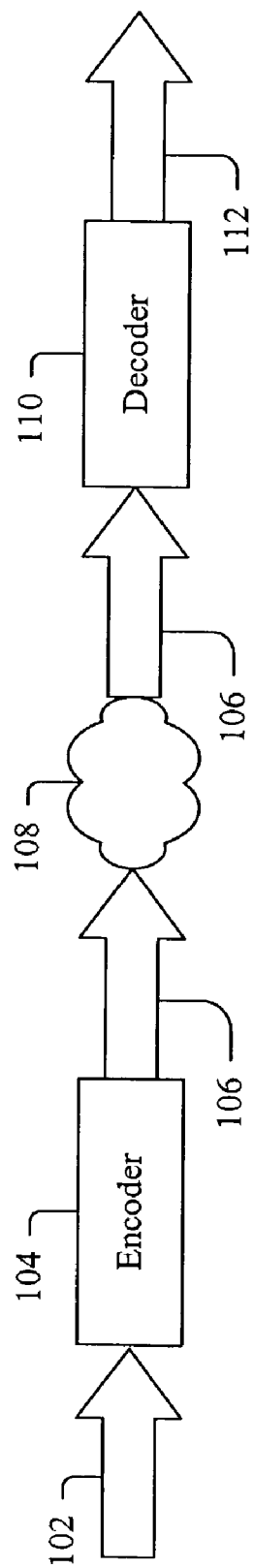
FIG. 1 is a system diagram illustrating an exemplary system, which may employ LZJH data compression with minimum redundancy coding, according to the present invention.

Referring now to the drawings, wherein like reference numerals designate identical or corresponding parts throughout the several views, and more particularly to FIG. 1 thereof, there is illustrated a system 100 for implementing the LZJH Data Compression algorithm with minimum redundancy coding, according to the present invention. In FIG. 1, the system 100 includes an encoder 104 and a decoder 110 [2]. The encoder 104 compresses the input data 102 and transfers compressed data 106 over a communications channel 108 to the decoder 110. The decoder 110 processes the compressed data 106 to recreate the original input data as output data 112. The LZJH algorithm typically employs four different types of compressed codes for compressed data transfer between the encoder 104 and the decoder 110, described, for example, as follows:

Ordinal—a code that represents a character, the code value is the ordinal value of the character using either 7 or 8 bits. The range of ordinal codes is from 0 to 255.

Control Code—a code that indicates control information. There are four control codes, values 0 to 3 of the range of codewords.

Codeword—a code that indicates a multi-character string, the codeword value corresponds to a string of characters in the dictionary that duplicates a previously seen string of characters. The range of codeword codes is from 4 to N, where N is normally a power of 2 and typically 1024, 2048, or 4096. However, N defaults to 1525 in the IPComp application for LZJH described in RFC3051 [6].

String-extension Length—a code that represents the number of characters by which the previously processed codewords string is extended. The range of string-extension length codes is from 1 to 253.

The present invention further encodes the compressed codes from the LZJH algorithm using fixed or dynamic Huffman coding [1] to generate the compressed data 106. Huffman coding is based upon constructing minimum redundancy prefix codes for an alphabet depending upon the expected (fixed) or actual (dynamic) frequency of each item in the alphabet. The codes are assigned to each item in an alphabet such that items that occur more frequently have codes with fewer bits than items that occur less frequently. Using fixed coding for the English alphabet, for instance, the letter 'T' would be assigned a prefix code with fewer bits than the letter 'X'. Using dynamic coding, the number of times each character occurs is counted while processing the input data, and codes are assigned based upon the frequency of each.

In Huffman dynamic coding, the alphabet generated by the encoder 104, while processing the data 102, indicating the coding of each item, is typically transferred along with the compressed data 106, such that the transferred data 106 can be interpreted and correctly decompressed by the decoder 110. In Huffman fixed coding, the alphabet typically is not transferred since both the encoder 104 and decoder 110 know the coding of each item ahead of time. According to the present invention, both types of Huffman coding can be employed as a potential second LZJH step by determining which is most advantageous during the encoding process and transferring a signal with the compressed data 106 to indicate to the decoder 110 the type of Huffman encoding that has been used by the encoder 104. In addition, to further reduce the data 106 transferred to the decoder 110, if the encoder 104 uses Huffman dynamic coding, Huffman fixed coding can be applied to the alphabet transferred to the decoder 110.

The system 100 may include any suitable servers, workstations, personal computers (PCs), personal digital assistants (PDAs), Internet appliances, set top boxes, other devices, etc., capable of performing the processes of the present invention. The encoder 104 and the decoder 110 of the system 100 may communicate with each other using any suitable protocol, for example, via the communications channel 108 and may be implemented using the computer system 301 of FIG. 3, for example. One or more interface mechanisms may be used in the system 100, for example, including Internet access, telecommunications in any form (e.g., voice, modem, etc.), wireless communications media, etc., via the communications channel 108. Accordingly, the communications channel 108 may include, for example, the Internet, an Intranet, a wireless communications channel, a satellite communications channel, a cellular communications channel, a hybrid communications channel, etc.

It is to be understood that the system in FIG. 1 is for exemplary purposes only, as many variations of the specific hardware used to implement the present invention are possible, as will be appreciated by those skilled in the relevant art(s). For example, the functionality of the encoder 104 and the decoder 110 of the system 100 may be implemented via one or more programmed computers or devices. To implement such variations as well as other variations, a single computer (e.g., the computer system 301 of FIG. 3) may be programmed to perform the special purpose functions of, for example, the encoder 104 and the decoder 110 shown in FIG. 1. On the other hand, two or more programmed computers or devices, for example as in shown FIG. 3, may be substituted for any one of the encoder 104 and the decoder 110. Principles and advantages of distributed processing, such as redundancy, replication, etc., may also be implemented as desired to increase the robustness and performance of the system 100, for example.

The communications channel 108 may be implemented via one or more communications channels (e.g., the Internet, an Intranet, a wireless communications channel, a satellite communications channel, a cellular communications channel, a hybrid communications channel, etc.), as will be appreciated by those skilled in the relevant art(s). In a preferred embodiment of the present invention, the communications channel 108 preferably uses electrical, electromagnetic, optical signals, etc., that carry digital data streams, as are further described with respect to FIG. 3.

Figure 2A:
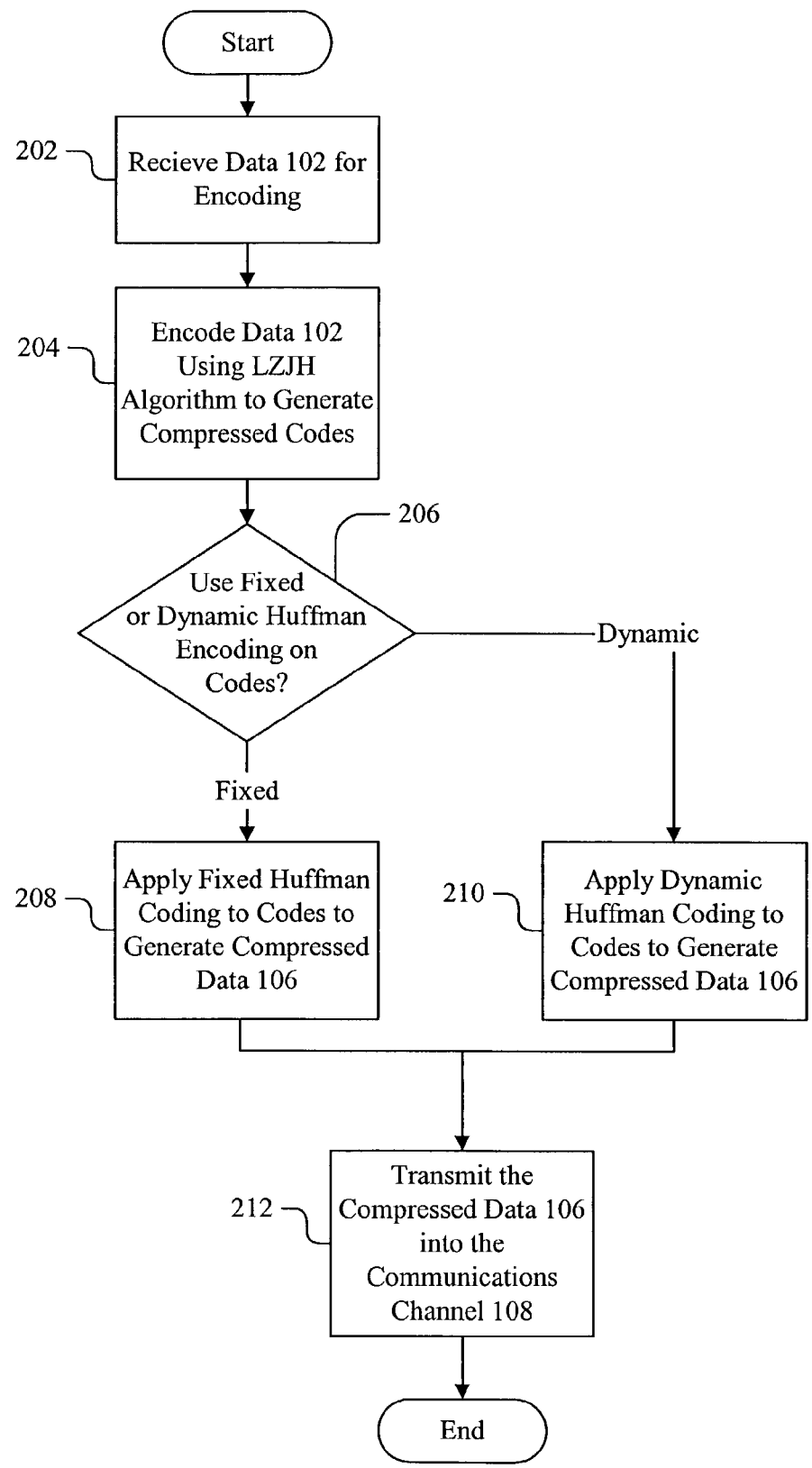
FIGS. 2a–2d are flow charts illustrating LZJH data compression with minimum redundancy coding, according to the present invention.

FIGS. 2a–2d are flow charts illustrating LZJH data compression with Huffman coding, according to the present invention. In FIG. 2a, the encoding process begins at step 202, wherein the encoder 104 receives the input data 102. At step 204, the data 102 is encoded using the LZJH algorithm to generate the four different types of compressed codes, as previously described. At step 206, it is determined whether to use fixed or dynamic Huffman coding on the compressed codes as the second processing step. If fixed Huffman coding is used, at step 208, the compressed codes are further coded using fixed Huffman coding to generate the compressed data 106. Otherwise, at step 210, the compressed codes are further coded using dynamic Huffman coding to generate the compressed data 106. At step 210, the encoder 104 transmits the compressed data 106 into the communications channel 108, completing the encoding process.

Figure 2B:
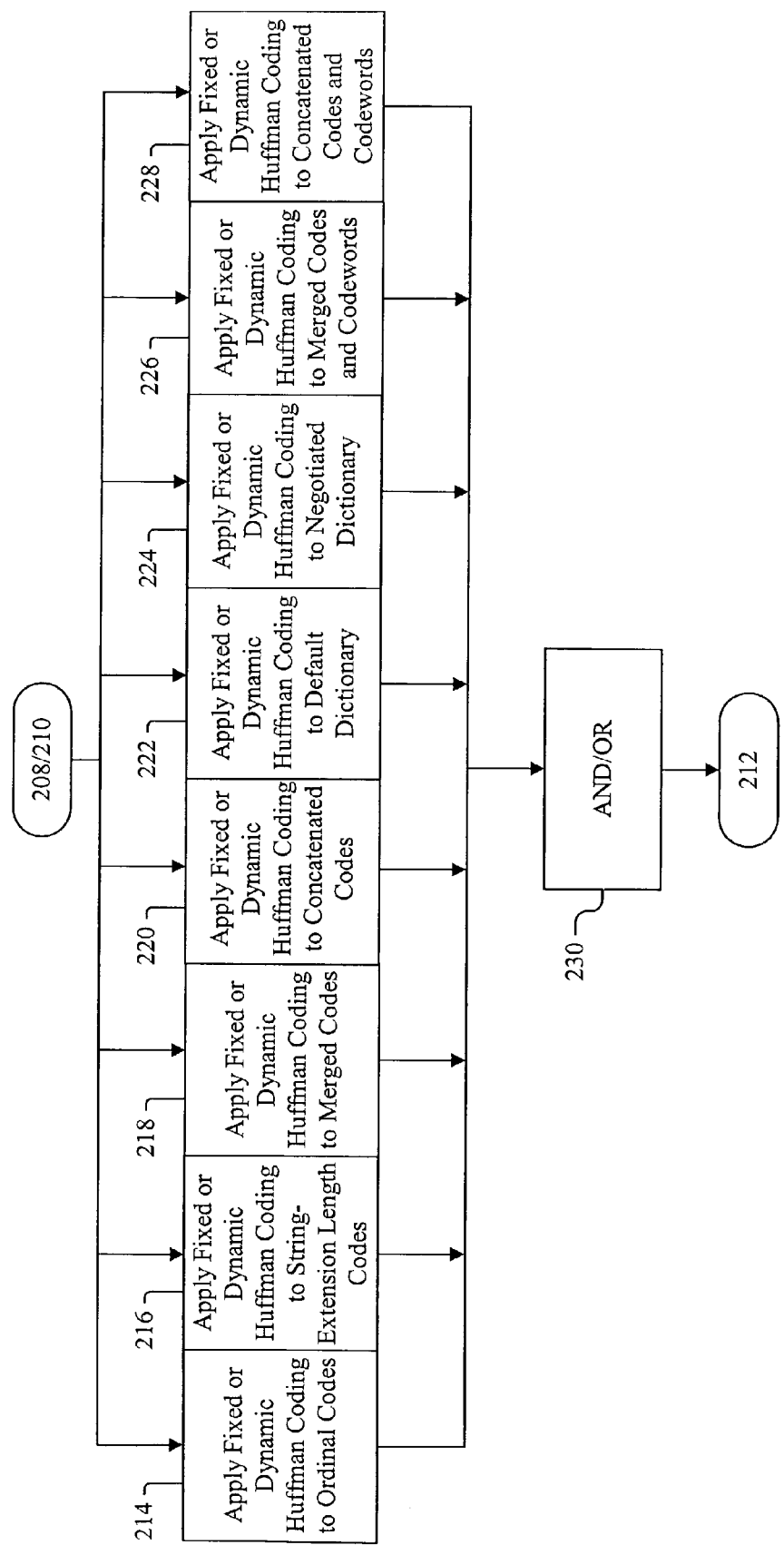

According to the present invention, Huffman coding may improve the compression efficiency of the LZJH algorithm from steps 208 or 210 by implementing one or more of the following processes on the compressed codes, as described with respect to FIG. 2b:

Applying Huffman dynamic or fixed coding to the 256 possible ordinal codes (step 214).

Applying Huffman dynamic or fixed coding to the 253 possible string-extension length codes (step 216).

Merging ordinals and string-extension lengths into the same alphabet and applying Huffman dynamic or fixed coding to the 256 possible codes (step 218).

Concatenating string-extension lengths onto the ordinal alphabet and applying Huffman dynamic or fixed coding to the 509 possible codes (step 220).

Applying Huffman dynamic or fixed coding to the 1525 possible codeword codes of the default dictionary defined in ITU-T V0.44 with Packet Method operation [6] (step 222).

Applying Huffman dynamic or fixed coding to all possible codeword codes of a dictionary whose size is negotiated between two peers (step 224).

Merging codewords, ordinals, and string-extension lengths into the same alphabet and applying Huffman dynamic or fixed coding to all possible codes (step 226).

Concatenating the codeword, ordinal, and string-extension alphabets and applying Huffman dynamic or fixed coding to all possible codes (step 228).

At step 230, one or more of the above-noted steps 214–228 are applied on the compressed codes from steps 208 or 210 and control is transferred to step 212.

It should be noted that when applying Huffman dynamic coding to an alphabet of compressed codes, those codes that do not appear in the compressed output typically are not assigned a Huffman code. As will be appreciated by those skilled in the relevant art(s), the above processes described with respect to FIG. 2b are exemplary and should not be considered an exhaustive list of all processes by which the compressed output of the LZJH Data Compression algorithm can be further compressed by Huffman or other types of minimum redundancy coding.

Figure 2C:
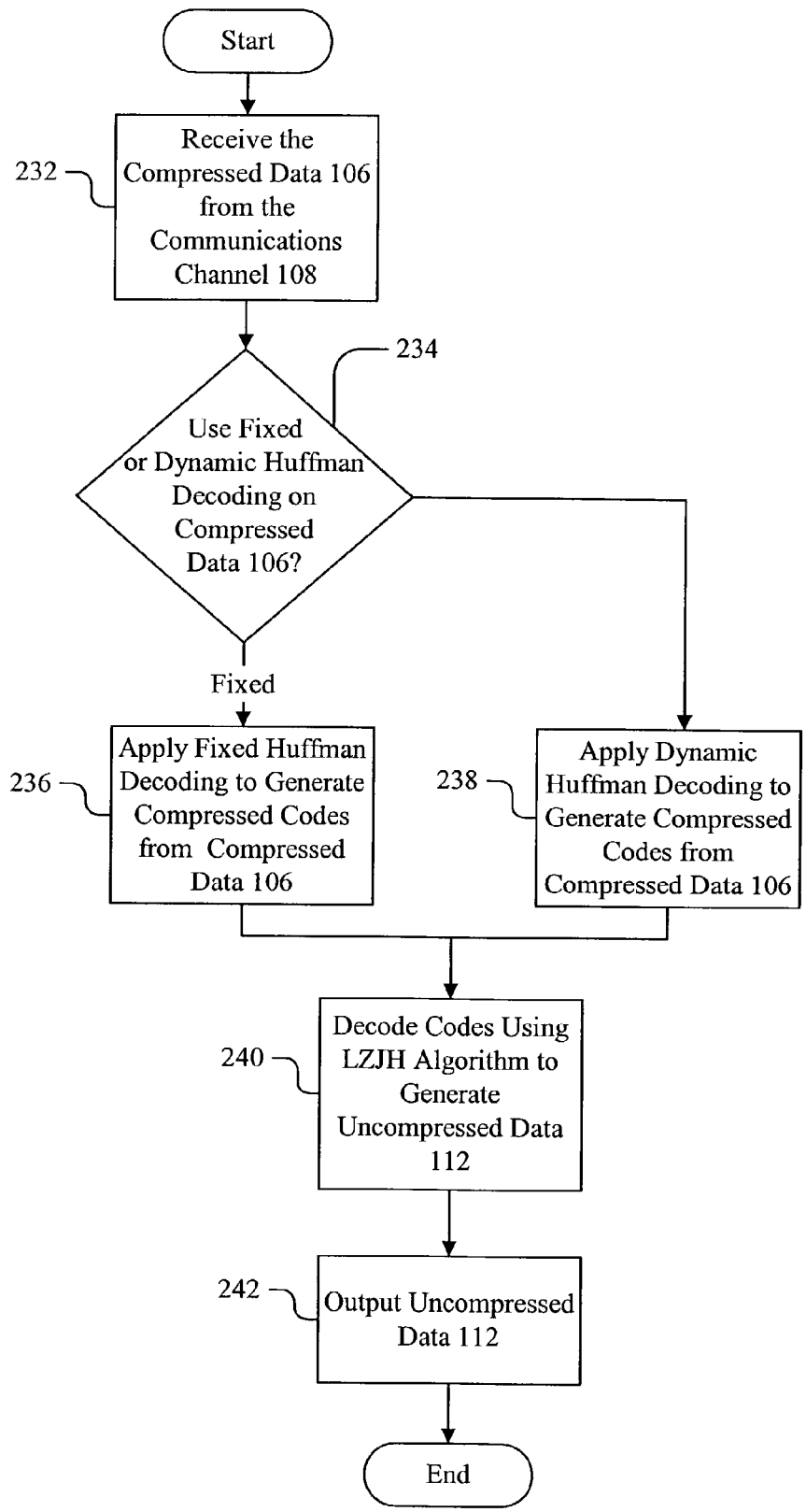
Figure 2D:
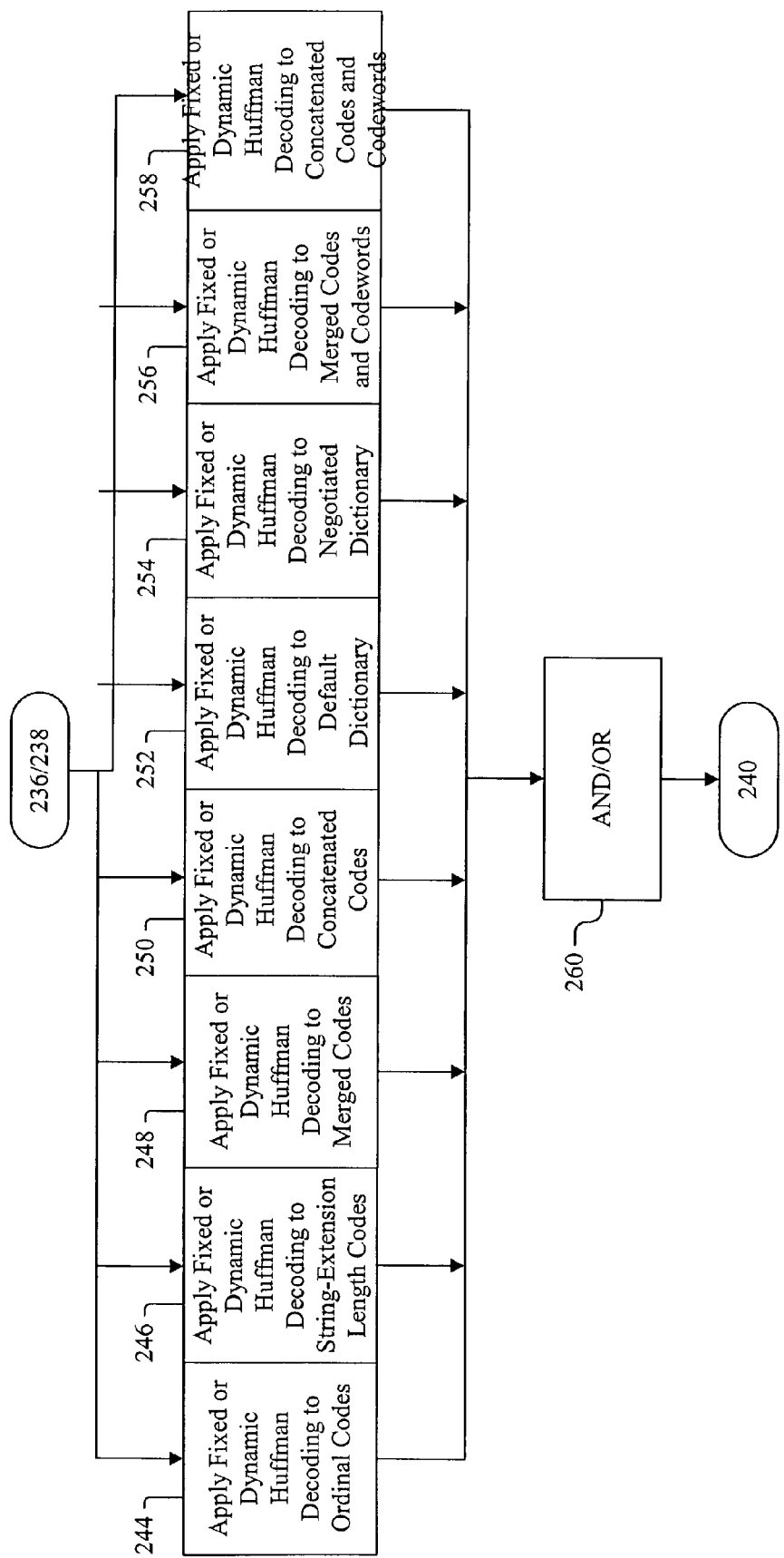

FIGS. 2c–2d are flow charts illustrating the decoding processes performed by the decoder 110 according to the present invention. As will be appreciated by those skilled in the relevant art(s), the decoding process is the inverse of the encoding process described with respect to FIGS. 2a–2b and a description thereof will be omitted herein for the sake of brevity.

The present invention stores information relating to various processes described herein. This information is stored in one or more memories, such as a hard disk, optical disk, magneto-optical disk, RAM, etc. One or more databases, such as databases within the encoder 104 and the decoder 110 of the system 100, etc., may store the information used to implement the present invention. The databases are organized using data structures (e.g., records, tables, arrays, fields, graphs, trees, and/or lists) contained in one or more memories, such as the memories listed above or any of the storage devices listed below in the discussion of FIG. 3, for example.

The previously described processes include appropriate data structures for storing data collected and/or generated by the processes of the system 100 of FIG. 1 in one or more databases thereof. Such data structures accordingly will includes fields for storing such collected and/or generated data. In a database management system, data is stored in one or more data containers, each container contains records, and the data within each record is organized into one or more fields. In relational database systems, the data containers are referred to as tables, the records are referred to as rows, and the fields are referred to as columns. In object-oriented databases, the data containers are referred to as object classes, the records are referred to as objects, and the fields are referred to as attributes. Other database architectures may use other terminology. Systems that implement the present invention are not limited to any particular type of data container or database architecture. However, for the purpose of explanation, the terminology and examples used herein shall be that typically associated with relational databases. Thus, the terms "table," "row," and "column" shall be used herein to refer respectively to the data container, record, and field.

The present invention (e.g., as described with respect to FIGS. 1–2) may be implemented by the preparation of application-specific integrated circuits or by interconnecting an appropriate network of conventional component circuits, as will be appreciated by those skilled in the electrical art(s). In addition, all or a portion of the invention (e.g., as described with respect to FIGS. 1–2) may be conveniently implemented using one or more conventional general purpose computers, microprocessors, digital signal processors, micro-controllers, etc., programmed according to the teachings of the present invention (e.g., using the computer system of FIG. 3), as will be appreciated by those skilled in the computer and software art(s). Appropriate software can be readily prepared by programmers of ordinary skill based on the teachings of the present disclosure, as will be appreciated by those skilled in the software art. Further, the present invention may be implemented on the World Wide Web (e.g., using the computer system of FIG. 3).

Figure 3:
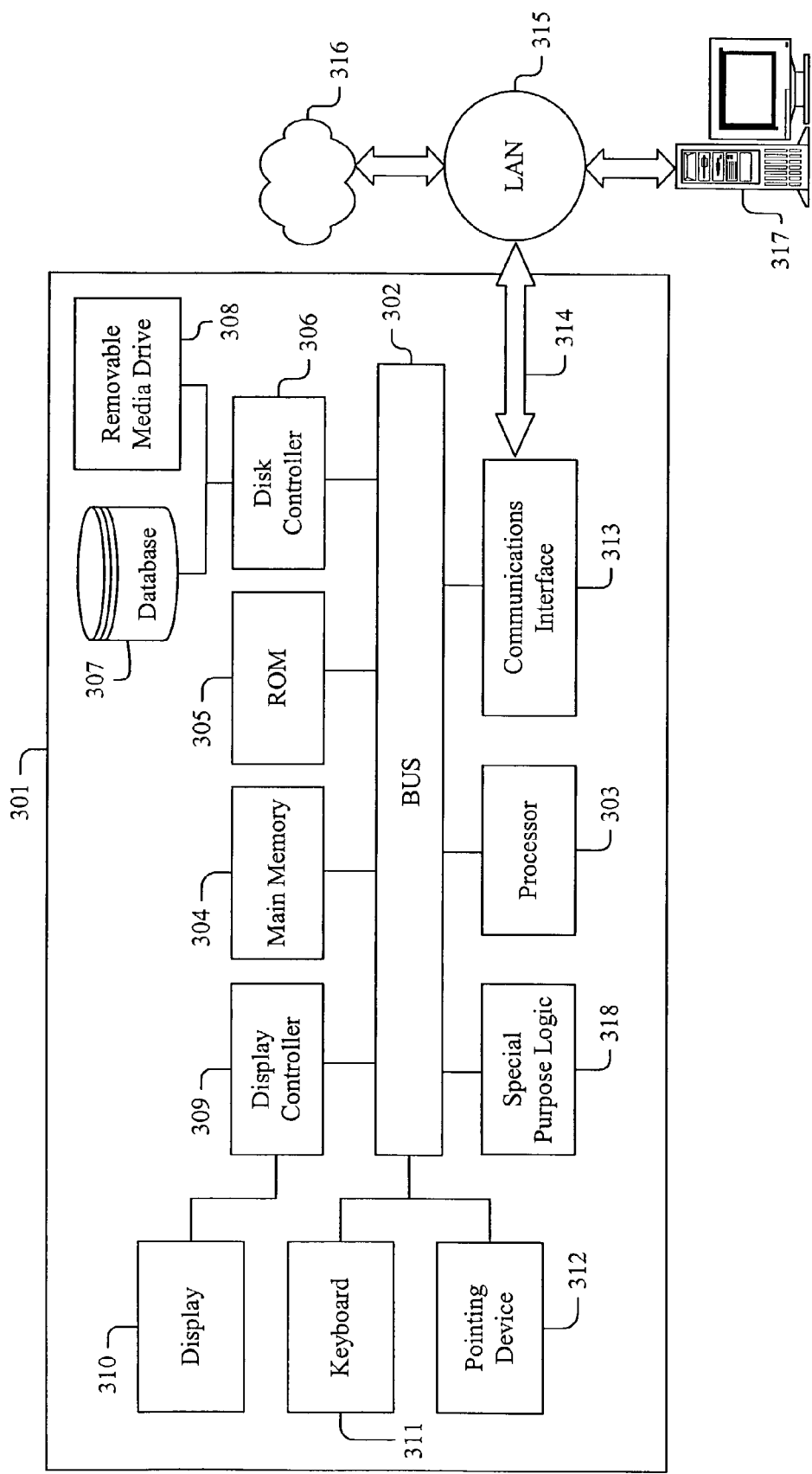
FIG. 3 is an exemplary computer system, which may be programmed to perform one or more of the processes of the present invention.

FIG. 3 illustrates a computer system 301 upon which the present invention (e.g., the encoder 104, the decoder 110, the system 100, etc.) can be implemented. The present invention may be implemented on a single such computer system, or a collection of multiple such computer systems. The computer system 301 includes a bus 302 or other communication mechanism for communicating information, and a processor 303 coupled to the bus 302 for processing the information. The computer system 301 also includes a main memory 304, such as a random access memory (RAM), other dynamic storage device (e.g., dynamic RAM (DRAM), static RAM (SRAM), synchronous DRAM (SDRAM)), etc., coupled to the bus 302 for storing information and instructions to be executed by the processor 303. In addition, the main memory 304 can also be used for storing temporary variables or other intermediate information during the execution of instructions by the processor 303. The computer system 301 further includes a read only memory (ROM) 305 or other static storage device (e.g., programmable ROM (PROM), erasable PROM (EPROM), electrically erasable PROM (EEPROM), etc.) coupled to the bus 302 for storing static information and instructions.

The computer system 301 also includes a disk controller 306 coupled to the bus 302 to control one or more storage devices for storing information and instructions, such as a magnetic hard disk 307, and a removable media drive 308 (e.g., floppy disk drive, read-only compact disc drive, read/write compact disc drive, compact disc jukebox, tape drive, and removable magneto-optical drive). The storage devices may be added to the computer system 301 using an appropriate device interface (e.g., small computer system interface (SCSI), integrated device electronics (IDE), enhanced-IDE (E-IDE), direct memory access (DMA), or ultra-DMA).

The computer system 301 may also include special purpose logic devices 318, such as application specific integrated circuits (ASICs), full custom chips, configurable logic devices (e.g., simple programmable logic devices (SPLDs), complex programmable logic devices (CPLDs), field programmable gate arrays (FPGAs), etc.), etc., for performing special processing functions, such as signal processing, image processing, speech processing, voice recognition, infrared (IR) data communications, satellite communications transceiver functions, encoder 104 functions, decoder 110 functions, etc.

The computer system 301 may also include a display controller 309 coupled to the bus 302 to control a display 310, such as a cathode ray tube (CRT), liquid crystal display (LCD), active matrix display, plasma display, touch display, etc., for displaying or conveying information to a computer user. The computer system includes input devices, such as a keyboard 311 including alphanumeric and other keys and a pointing device 312, for interacting with a computer user and providing information to the processor 303. The pointing device 312, for example, may be a mouse, a trackball, a pointing stick, etc., or voice recognition processor, etc., for communicating direction information and command selections to the processor 303 and for controlling cursor movement on the display 310. In addition, a printer may provide printed listings of the data structures/information of the system shown in FIG. 1, or any other data stored and/or generated by the computer system 301.

The computer system 301 performs a portion or all of the processing steps of the invention in response to the processor 303 executing one or more sequences of one or more instructions contained in a memory, such as the main memory 304. Such instructions may be read into the main memory 304 from another computer readable medium, such as a hard disk 307 or a removable media drive 308. Execution of the arrangement of instructions contained in the main memory 304 causes the processor 303 to perform the process steps described herein. One or more processors in a multi-processing arrangement may also be employed to execute the sequences of instructions contained in main memory 304. In alternative embodiments, hard-wired circuitry may be used in place of or in combination with software instructions. Thus, embodiments are not limited to any specific combination of hardware circuitry and software.

Stored on any one or on a combination of computer readable media, the present invention includes software for controlling the computer system 301, for driving a device or devices for implementing the invention, and for enabling the computer system 301 to interact with a human user (e.g., users of the system 100 of FIG. 1, etc.). Such software may include, but is not limited to, device drivers, operating systems, development tools, and applications software. Such computer readable media further includes the computer program product of the present invention for performing all or a portion (if processing is distributed) of the processing performed in implementing the invention. Computer code devices of the present invention may be any interpretable or executable code mechanism, including but not limited to scripts, interpretable programs, dynamic link libraries (DLLs), Java classes and applets, complete executable programs, Common Object Request Broker Architecture (CORBA) objects, etc. Moreover, parts of the processing of the present invention may be distributed for better performance, reliability, and/or cost.

The computer system 301 also includes a communication interface 313 coupled to the bus 302. The communication interface 313 provides a two-way data communication coupling to a network link 314 that is connected to, for example, a local area network (LAN) 315, or to another communications network 316 such as the Internet. For example, the communication interface 313 may be a digital subscriber line (DSL) card or modem, an integrated services digital network (ISDN) card, a cable modem, a telephone modem, etc., to provide a data communication connection to a corresponding type of telephone line. As another example, communication interface 313 may be a local area network (LAN) card (e.g., for Ethernet™, an Asynchronous Transfer Model (ATM) network, etc.), etc., to provide a data communication connection to a compatible LAN. Wireless links can also be implemented. In any such implementation, communication interface 313 sends and receives electrical, electromagnetic, or optical signals that carry digital data streams representing various types of information. Further, the communication interface 313 can include peripheral interface devices, such as a Universal Serial Bus (USB) interface, a PCMCIA (Personal Computer Memory Card International Association) interface, etc.

The network link 314 typically provides data communication through one or more networks to other data devices. For example, the network link 314 may provide a connection through local area network (LAN) 315 to a host computer 317, which has connectivity to a network 316 (e.g. a wide area network (WAN) or the global packet data communication network now commonly referred to as the "Internet") or to data equipment operated by service provider. The local network 315 and network 316 both use electrical, electromagnetic, or optical signals to convey information and instructions. The signals through the various networks and the signals on network link 314 and through communication interface 313, which communicate digital data with computer system 301, are exemplary forms of carrier waves bearing the information and instructions.

The computer system 301 can send messages and receive data, including program code, through the network(s), network link 314, and communication interface 313. In the Internet example, a server (not shown) might transmit requested code belonging an application program for implementing an embodiment of the present invention through the network 316, LAN 315 and communication interface 313. The processor 303 may execute the transmitted code while being received and/or store the code in storage devices 307 or 308, or other non-volatile storage for later execution. In this manner, computer system 301 may obtain application code in the form of a carrier wave. With the system of FIG. 3, the present invention may be implemented on the Internet as a Web Server 301 performing one or more of the processes according to the present invention for one or more computers coupled to the Web server 301 through the network 316 coupled to the network link 314.

The term "computer readable medium" as used herein refers to any medium that participates in providing instructions to the processor 303 for execution. Such a medium may take many forms, including but not limited to, non-volatile media, volatile media, transmission media, etc. Non-volatile media include, for example, optical or magnetic disks, magneto-optical disks, etc., such as the hard disk 307 or the removable media drive 308. Volatile media include dynamic memory, etc., such as the main memory 304. Transmission media include coaxial cables, copper wire, fiber optics, including the wires that make up the bus 302. Transmission media can also take the form of acoustic, optical, or electromagnetic waves, such as those generated during radio frequency (RF) and infrared (IR) data communications. As stated above, the computer system 301 includes at least one computer readable medium or memory for holding instructions programmed according to the teachings of the invention and for containing data structures, tables, records, or other data described herein. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer connected to either of networks 315 and 316. In such a scenario, the remote computer loads the instructions into main memory and sends the instructions, for example, over a telephone line using a modem. A modem of a local computer system receives the data on the telephone line and uses an infrared transmitter to convert the data to an infrared signal and transmit the infrared signal to a portable computing device, such as a personal digital assistant (PDA), a laptop, an Internet appliance, etc. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Recapitulating, the present invention modifies the Lempel-Ziv-Jeff-Heath (LZJH) Data Compression algorithm such that there is a second step consisting of fixed or dynamic Huffman coding, etc., based on whichever is determined to be more advantageous for a given application. The second step in certain applications should further reduce the compressed output of the LZJH algorithm resulting in better compression ratios.

Although the present invention is described in terms of the encoder 104 and the decoder 110 used in communications channel 108 (e.g., the Internet, an Intranet, a wireless communications channel, a satellite communications channel, a cellular communications channel, etc.), the present invention is applicable to other communications channels and systems that may employ data compression and/or decompression, such as Virtual Private Networks (VPNs) employing IPComp, etc., as will be appreciated by those skilled in the relevant art(s).

While the present invention has been described in connection with a number of embodiments and implementations, the present invention is not so limited but rather covers various modifications and equivalent arrangements, which fall within the purview of the appended claims.

LIST OF REFERENCES

[1] e.g., as taught in: Solomon, "Data Compression: The Complete Reference," 2nd edition, Springer Verlag, ISBN: 0387950451 (October 2000); Sayood, "Introduction to Data Compression," 2nd edition, Morgan Kaufmann Publishers, ISBN: 1558605584 (March 2000); Hankerson et al, "Introduction to Information Theory and Data Compression," CRC Press, ISBN: 0849339855 (November 1997); and Nelson et al, "The Data Compression Book," (November 1995).

[2] e.g., as taught in U.S. Pat. Nos. 5,955,976 and 5,973,630 to Heath.

[3] e.g., as taught in faqs.org/rfcs/rfc1951.html, available on the World Wide Web.

[4] e.g., as taught in faqs.org/rfcs/rfc2394.html, available on the World Wide Web.

[5] This data compression standard is developed and marketed by STAC Incorporated to be used over PPP (Internet) connections. STAC LZS is widely supported by many types of equipment and can triple data rates with highly compressible files. Though STAC LZS compression is currently supported by many ISDN routers, it is a rare feature of ISDN modems and adapters.

[6] e.g., as taught in faqs.org/rfcs/rfc3051.html, available on the World Wide Web.

What is claimed is:

1. A method for encoding and decoding data over a communications channel, comprising:
receiving input data to be encoded;
generating compressed codes from the input data using a Lempel-Ziv-Jeff-Heath (LZJH) data compression algorithm; and
applying a minimum redundancy coding algorithm on the compressed codes to generate compressed data.

2. The method of claim 1, further comprising:
transmitting the compressed data over the communications channel.

3. The method of claim 1, wherein the applying step comprises applying the minimum redundancy coding algorithm comprising a Huffman coding algorithm.

4. The method of claim 3, wherein the applying step comprises applying the Huffman coding algorithm comprising a fixed Huffman coding algorithm.

5. The method of claim 3, wherein the applying step comprises applying the Huffman coding algorithm comprising a dynamic Huffman coding algorithm.

6. The method of claim 2, wherein the transmitting step comprises transmitting the compressed data over the communications channel comprising one of the Internet, an Intranet, a wireless communications channel, a satellite communications channel, a cellular communications channel and a hybrid communications channel.

7. The method of claim 1, wherein the applying step comprises applying the minimum redundancy coding algorithm on at least one of the compressed codes comprising ordinal codes, control codes, codewords and string-extension length codes.

8. The method of claim 7, wherein the applying step comprises applying the minimum redundancy coding algorithm on the ordinal codes.

9. The method of claim 7, wherein the applying step comprises applying the minimum redundancy coding algorithm on the string-extension length codes.

10. The method of claim 7, wherein the applying step comprises applying the minimum redundancy coding algorithm on the ordinal codes and the string-extension length codes merged into a same alphabet.

11. The method of claim 7, wherein the applying step comprises applying the minimum redundancy coding algorithm on the string-extension length codes concatenated onto an ordinal alphabet.

12. The method of claim 7, wherein the applying step comprises applying the minimum redundancy coding algorithm on the codewords of a default dictionary.

13. The method of claim 7, wherein the applying step comprises applying the minimum redundancy coding algorithm on the codewords of a dictionary whose size is negotiated between two peers.

14. The method of claim 7, wherein the applying step comprises applying the minimum redundancy coding algorithm on the ordinal codes, the string-extension length codes and the codewords merged into a same alphabet.

15. The method of claim 7, wherein the applying step comprises applying the minimum redundancy coding algorithm on concatenated codeword, ordinal and string-extension alphabets.

16. The method of claim 1, further comprising:
receiving the compressed data to be decoded;
applying a minimum redundancy decoding algorithm on the compressed data to generate the compressed codes; and
generating the input data from the compressed codes using a Lempel-Ziv-Jeff-Heath (LZJH) data decompression algorithm.

17. The method of claim 16, wherein the compressed data is received over the communications channel.

18. The method of claim 16, wherein the minimum redundancy decoding algorithm comprises a Huffman decoding algorithm.

19. The method of claim 18, wherein the Huffman decoding algorithm comprises a fixed Huffman decoding algorithm.

20. The method of claim 18, wherein the Huffman decoding algorithm comprises a dynamic Huffman decoding algorithm.

21. The method of claim 17, wherein the communications channel comprising one of the Internet, an Intranet, a wireless communications channel, a satellite communications channel, a cellular communications channel or hybrid communications channel.

22. A computer-readable medium carrying one or more sequences of one or more instructions for encoding and decoding data over a communications channel, the one or more sequences of one or more instructions including instructions which, when executed by one or more processors, cause the one or more processors to perform the following steps:
receiving input data to be encoded;
generating compressed codes from the input data using a Lempel-Ziv-Jeff-Heath (LZJH) data compression algorithm; and
applying a minimum redundancy coding algorithm on the compressed codes to generate compressed data.

23. The computer-readable medium of claim 22, further performing the step of:
transmitting the compressed data over the communications channel.

24. The computer-readable medium of claim 22, wherein the applying step comprises applying the minimum redundancy coding algorithm comprising a Huffman coding algorithm.

25. The computer-readable medium of claim 24, wherein the applying step comprises applying the Huffman coding algorithm comprising a fixed Huffman coding algorithm.

26. The computer-readable medium of claim 24, wherein the applying step comprises applying the Huffman coding algorithm comprising a dynamic Huffman coding algorithm.

27. The computer-readable medium of claim 23, wherein the transmitting step comprises transmitting the compressed data over the communications channel comprising one of the Internet, an Intranet, a wireless communications channel, a satellite communications channel, a cellular communications channel and a hybrid communications channel.

28. The computer-readable medium of claim 22, wherein the applying step comprises applying the minimum redundancy coding algorithm on at least one of the compressed codes comprising ordinal codes, control codes, codewords and string-extension length codes.

29. The computer-readable medium of claim 28, wherein the applying step comprises applying the minimum redundancy coding algorithm on the ordinal codes.

30. The computer-readable medium of claim 28, wherein the applying step comprises applying the minimum redundancy coding algorithm on the string-extension length codes.

31. The computer-readable medium of claim 28, wherein the applying step comprises applying the minimum redundancy coding algorithm on the ordinal codes and the string-extension length codes merged into a same alphabet.

32. The computer-readable medium of claim 28, wherein the applying step comprises applying the minimum redundancy coding algorithm on the string-extension length codes concatenated onto an ordinal alphabet.

33. The computer-readable medium of claim 28, wherein the applying step comprises applying the minimum redundancy coding algorithm on the codewords of a default dictionary.

34. The computer-readable medium of claim 28, wherein the applying step comprises applying the minimum redundancy coding algorithm on the codewords of a dictionary whose size is negotiated between two peers.

35. The computer-readable medium of claim 28, wherein the applying step comprises applying the minimum redundancy coding algorithm on the ordinal codes, the string-extension length codes and the codewords merged into a same alphabet.

36. The computer-readable medium of claim 28, wherein the applying step comprises applying the minimum redundancy coding algorithm on concatenated codeword, ordinal and string-extension alphabets.

37. The computer-readable medium of claim 22, further performing the steps of:
receiving the compressed data to be decoded;
applying a minimum redundancy decoding algorithm on the compressed data to generate the compressed codes; and
generating the input data from the compressed codes using a Lempel-Ziv-Jeff-Heath (LZJH) data decompression algorithm.

38. The computer-readable medium of claim 37, wherein the compressed data is received over the communications channel.

39. The computer-readable medium of claim 37, wherein the applying step comprises applying the minimum redundancy decoding algorithm comprising a Huffman decoding algorithm.

40. The computer-readable medium of claim 39, wherein the applying step comprises applying the Huffman decoding algorithm comprising a fixed Huffman decoding algorithm.

41. The computer-readable medium of claim 39, wherein the applying step comprises applying the Huffman decoding algorithm comprising a dynamic Huffman decoding algorithm.

42. The computer-readable medium of claim 38, wherein the compressed data over the communications channel comprising one of the Internet, an Intranet, a wireless communications channel, a satellite communications channel, a cellular communications channel and a hybrid communications channel.

43. A system for encoding and decoding data over a communications channel, comprising:
an encoder configured to receive input data to be encoded;
said encoder further configured to generate compressed codes from the input data using a Lempel-Ziv-Jeff-Heath (LZJH) data compression algorithm; and
said encoder further configured to apply a minimum redundancy coding algorithm on the compressed codes to generate compressed data.

44. The system of claim 43, further comprising:
said encoder further configured to transmit the compressed data over the communications channel.

45. The system of claim 43, wherein the minimum redundancy coding algorithm comprises a Huffman coding algorithm.

46. The system of claim 45, wherein the Huffman coding algorithm comprises a fixed Huffman coding algorithm.

47. The system of claim 45, wherein the Huffman coding algorithm comprises a dynamic Huffman coding algorithm.

48. The system of claim 44, wherein the communications channel comprises one of the Internet, an Intranet, a wireless communications channel, a satellite communications channel, a cellular communications channel and a hybrid communications channel.

49. The system of claim 43, wherein the encoder is configured to apply the minimum redundancy coding algorithm on at least one of the compressed codes comprising ordinal codes, control codes, codewords and string-extension length codes.

50. The system of claim 49, wherein the encoder is configured to apply the minimum redundancy coding algorithm on the ordinal codes.

51. The system of claim 49, wherein the encoder is configured to apply the minimum redundancy coding algorithm on the string-extension length codes.

52. The system of claim 49, wherein the encoder is configured to apply the minimum redundancy coding algorithm on the ordinal codes and the string-extension length codes merged into a same alphabet.

53. The system of claim 49, wherein the encoder is configured to apply the minimum redundancy coding algorithm on the string-extension length codes concatenated onto an ordinal alphabet.

54. The system of claim 49, wherein the encoder is configured to apply the minimum redundancy coding algorithm on the codewords of a default dictionary.

55. The system of claim 49, wherein the encoder is configured to apply the minimum redundancy coding algorithm on the codewords of a dictionary whose size is negotiated between two peers.

56. The system of claim 49, wherein the encoder is configured to apply the minimum redundancy coding algorithm on the ordinal codes, the string-extension length codes and the codewords merged into a same alphabet.

57. The system of claim 49, wherein the encoder is configured to apply the minimum redundancy coding algorithm on concatenated codeword, ordinal and string-extension alphabets.

58. The system of claim 43, further comprising:
a decoder configured to receive the compressed data to be decoded;
said decoder further configured to apply a minimum redundancy decoding algorithm on the compressed data to generate the compressed codes; and
said decoder further configured to generate the input data from the compressed codes using a Lempel-Ziv-Jeff-Heath (LZJH) data decompression algorithm.

59. The system of claim 58, wherein the compressed data is received over the communications channel.

60. The system of claim 58, wherein the decoder is configured to apply the minimum redundancy decoding algorithm comprising a Huffman decoding algorithm.

61. The system of claim 60, wherein the decoder is configured to apply the Huffman decoding algorithm comprising a fixed Huffman decoding algorithm.

62. The system of claim 60, wherein the decoder is configured to apply the Huffman decoding algorithm comprising a dynamic Huffman decoding algorithm.

63. The system of claim 59, wherein the communications channel comprises one of a connection over the Internet, a connection over an Intranet, a wireless communications channel, a satellite communications channel, a cellular communications channel or a hybrid communications channel.

64. An apparatus for encoding and decoding data over a communications channel, comprising:
means for receiving input data to be encoded;
means for generating compressed codes from the input data using a Lempel-Ziv-Jeff-Heath (LZJH) data compression algorithm; and
means for applying a minimum redundancy coding algorithm on the compressed codes to generate compressed data.

65. The apparatus of claim 64, further comprising:
means for receiving the compressed data to be decoded;
means for applying a minimum redundancy decoding algorithm on the compressed data to generate the compressed codes; and
means for generating the input data from the compressed codes using a Lempel-Ziv-Jeff-Heath (LZJH) data decompression algorithm.

66. A method for generating compressed data, comprising:
compressing input data using a Lempel-Ziv-Jeff-Heath (LZJH) data compression scheme; and
further compressing the LZJH compressed data using a Huffman coding scheme.

67. The method of claim 66, wherein the input data are packet data.

68. The method of claim 66, wherein the LZJH compressed data includes an ordinal code representing a character, a control code indicating control information, a codeword specifying a value corresponding to a string of characters, and a string-extension length code representing the number of characters by which previously processed codewords string is extended.

69. The method of claim 68, wherein the step of further compressing is performed on the ordinal code.

70. The method of claim 68, wherein the step of further compressing is performed on the string-extension length code.

71. The method of claim 68, further comprising:
merging the ordinal code and the string-extension length code onto an identical alphabet.

72. The method of claim 68, further comprising:
concatenating the string-extension length code onto an ordinal alphabet.

73. The method of claim 68, wherein the step of further compressing is performed on a plurality of codes of a predetermined dictionary.

74. The method of claim 73, wherein the size of the dictionary is pre-negotiated.

75. The method of claim 68, further comprising:
merging the codeword, the ordinal code and the string-extension length code onto an identical alphabet.

* * * * *